(12) United States Patent
Hermann

(10) Patent No.: US 6,970,219 B1
(45) Date of Patent: Nov. 29, 2005

(54) FLEXIBLE DISPLAY AND METHOD OF MAKING THE SAME

(75) Inventor: Scott J. Hermann, Hollister, CA (US)

(73) Assignee: Alien Technology Corporation, Morgan Hill, CA (US)

(*) Notice: Subject to any disclaimer, the term of this patent is extended or adjusted under 35 U.S.C. 154(b) by 93 days.

(21) Appl. No.: 10/624,582

(22) Filed: Jul. 21, 2003

Related U.S. Application Data

(60) Provisional application No. 60/399,085, filed on Jul. 26, 2002.

(51) Int. Cl.$^7$ .......................... G02F 1/1333; G02F 1/13
(52) U.S. Cl. ...................... 349/122; 349/1; 349/160
(58) Field of Search ........................ 349/149–152, 349/1, 4, 44, 158, 160; 257/678, 684, 693, 257/713

(56) References Cited

U.S. PATENT DOCUMENTS 6,069,679 A * 5/2000 Joslin et al. ............. 349/149

6,590,346 B1 * 7/2003 Hadley et al. ............ 315/169.3

* cited by examiner

Primary Examiner—Dung T. Nguyen
(74) Attorney, Agent, or Firm—Blakely, Sokoloff, Taylor & Zafman LLP

(57) ABSTRACT

An electronic device and method of fabricating the same. The device comprises a substrate having a display area and at least one receptor site configured to receive a functional block that is to be deposited within the receptor site, embedded below a surface of the substrate and situating outside the display area. A first barrier layer is deposited over the display area and not covering the functional block. A first patterned electrode layer is deposited over the first barrier layer. The first patterned electrode layer makes contact to the functional block. A display medium is deposited over the first patterned electrode layer. A second patterned electrode layer is deposited over the display medium. A second barrier layer is deposited over the second patterned electrode layer.

16 Claims, 3 Drawing Sheets

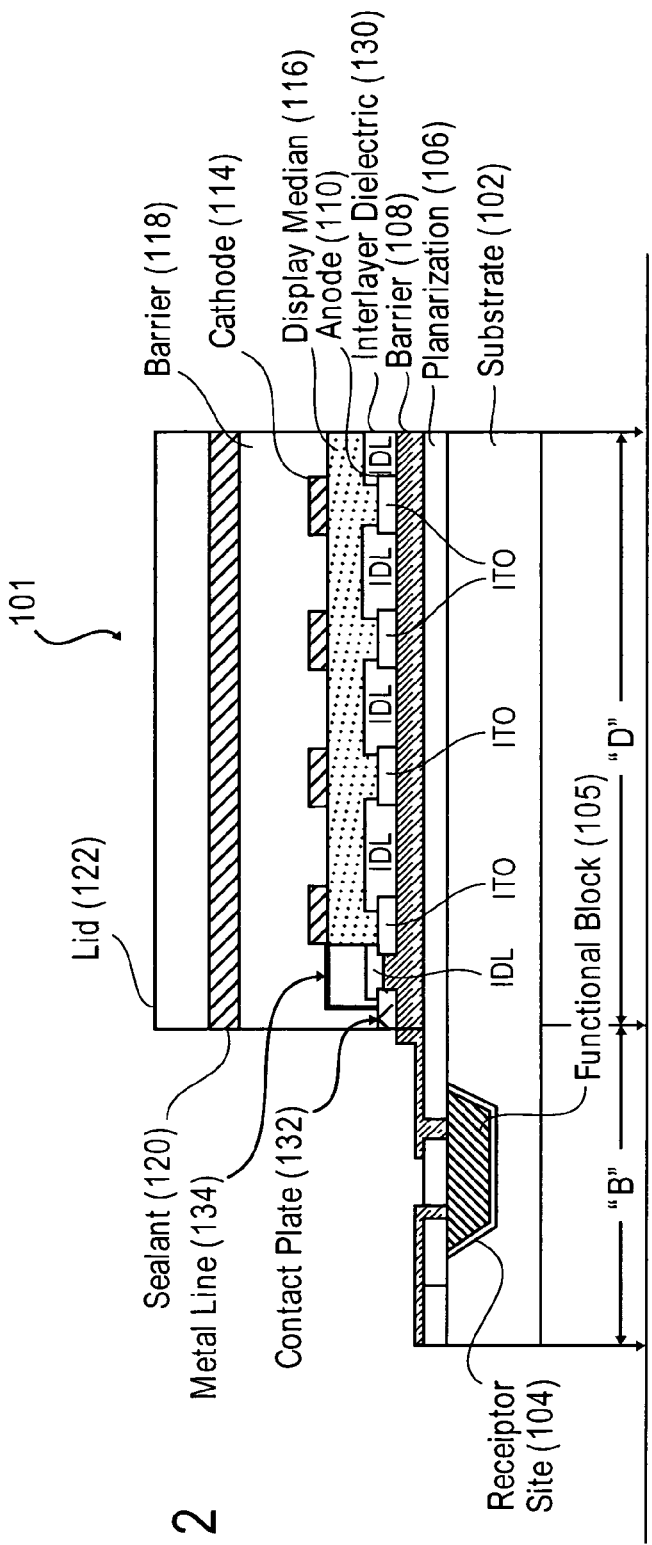
FIG. 2
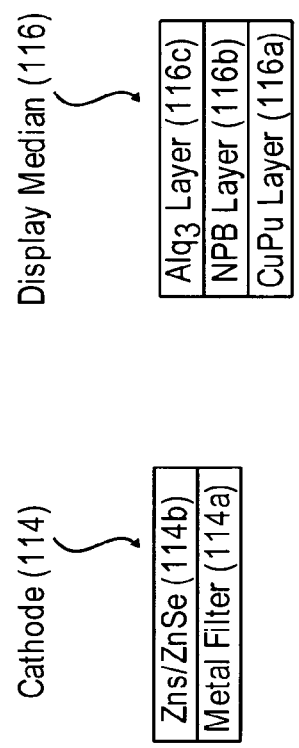
FIG. 3
FIG. 4

FLEXIBLE DISPLAY AND METHOD OF MAKING THE SAME

This application is related to U.S. Provisional Patent Application No. 60/399,085, which was filed on Jul. 26, 2002. This application claims the benefit of the provisional's filing date under 35 U.S.C. § 119(e).

BACKGROUND

A. Field

The present invention relates to an electronic device and a method of making the electronic device, and more particularly, to incorporating a functional block into an area on a substrate that is outside of a display area on the substrate and incorporating a barrier to protect a display medium that does not cover the area where the functional block resides.

B. Related Art

While the present invention has many aspects and embodiments, this section will focus on those aspects that relate to display devices. While there are a large number of various different types of flat panel display devices, one very common flat panel display device utilizes pixel electrodes to control a display medium such as a liquid crystal display (LCD) layer in order to create an image. These pixel electrodes may control other types of display media such as electrophoretic display media, organic light emitting diodes (OLED), or a polymer light emitting diode (PLED). Typically, a pixel electrode works by creating locally an electric field relative to another electrode. A display medium is sandwiched between the two electrodes and reacts to this electric field. Such display device can be an active matrix display or a passive matrix display such as those used in modern laptop computers, televisions, smart cards, or cellular phones.

In most of the flat panel displays, two glass plates are being used for carrying functional layers such as electro-conductive layers for pixel addressing and color filters. A display medium is sandwiched between these two glass plates. The display medium can be liquid crystal compounds for the LCDs, and light-emitting polymers for OLEDs or PLED. The assembly including the two glass plates and the display medium is typically referred to as a display cell. In most case, foils are laminated to the outer surface of the glass plates to improve the image quality.

Glass plates tend to make the display brittle, inflexible, heavy, and difficult to handle.

SUMMARY

The present invention relates to an electronic device fabricated on a plastic substrate. According to one aspect of the present invention, one of the embodiments relates to an assembly comprising a substrate having a display area and at least one receptor site configured to receive a functional block that is to be deposited within the receptor site, embedded below a surface of the substrate and situating outside the display area. A first barrier layer is deposited over the display area and not covering the functional block. A first patterned electrode layer is deposited over the first barrier layer. The first patterned electrode layer makes contact to the functional block. A display medium is deposited over the first patterned electrode layer. A second patterned electrode layer is deposited over the display medium. And, a second barrier layer is deposited over the second patterned electrode layer.

Other aspects and methods are also described herein.

BRIEF DESCRIPTION OF THE DRAWINGS

The present invention is illustrated by way of examples and not limitations in the figures of the accompanying drawings in which like references indicate similar elements.

FIG. 2 illustrates another exemplary display with the functional block being embedded within the display substrate and placed outside of the display area and the display area being substantially seal with barrier layers.

FIG. 3 illustrates an exemplary transparent cathode that can be used with some of the embodiments.

FIG. 4 illustrates an exemplary display medium stack that can be used with some of the embodiments.

DETAILED DESCRIPTION

The subject invention will be described with reference to numerous details set forth below and the accompanying drawings, which will illustrate the invention. The following description and drawings are illustrative of the invention and are not to be construed as limitations. Numerous specific details are described to provide a thorough understanding of this discussion. However, in certain instances, well-known or conventional details are not described in order to not unnecessarily obscure the present invention in detail. Further, various aspects of the exemplary embodiments will be described with reference to flat panel display systems. It will be appreciated that the reference to flat panel display systems is merely for purposes of illustration and are not to be construed as limitation.

The use of plastic for a substrate to make an electronic device such as a display enables many features, for example, flexibility, low cost, and easy of handling. Display medium used for such an electronic device needs to be protected from exposure to contaminants such as chemicals, oxygen, moisture, and other substances. Plastic may be permeable to these contaminants. A barrier layer to protect the display medium is thus necessary.

One of the embodiments relates to an assembly comprising a substrate having a display area and at least one receptor site configured to receive a functional block that is to be deposited within the receptor site, embedded below a surface of the substrate and situating outside the display area. A first barrier layer is deposited over the display area and not covering the functional block. A first patterned electrode layer is deposited over the first barrier layer. The first patterned electrode layer makes contact to the functional block. A display medium is deposited over the first patterned electrode layer. A second patterned electrode layer is deposited over the display medium. And, a second barrier layer is deposited over the second patterned electrode layer.

Figure 1:
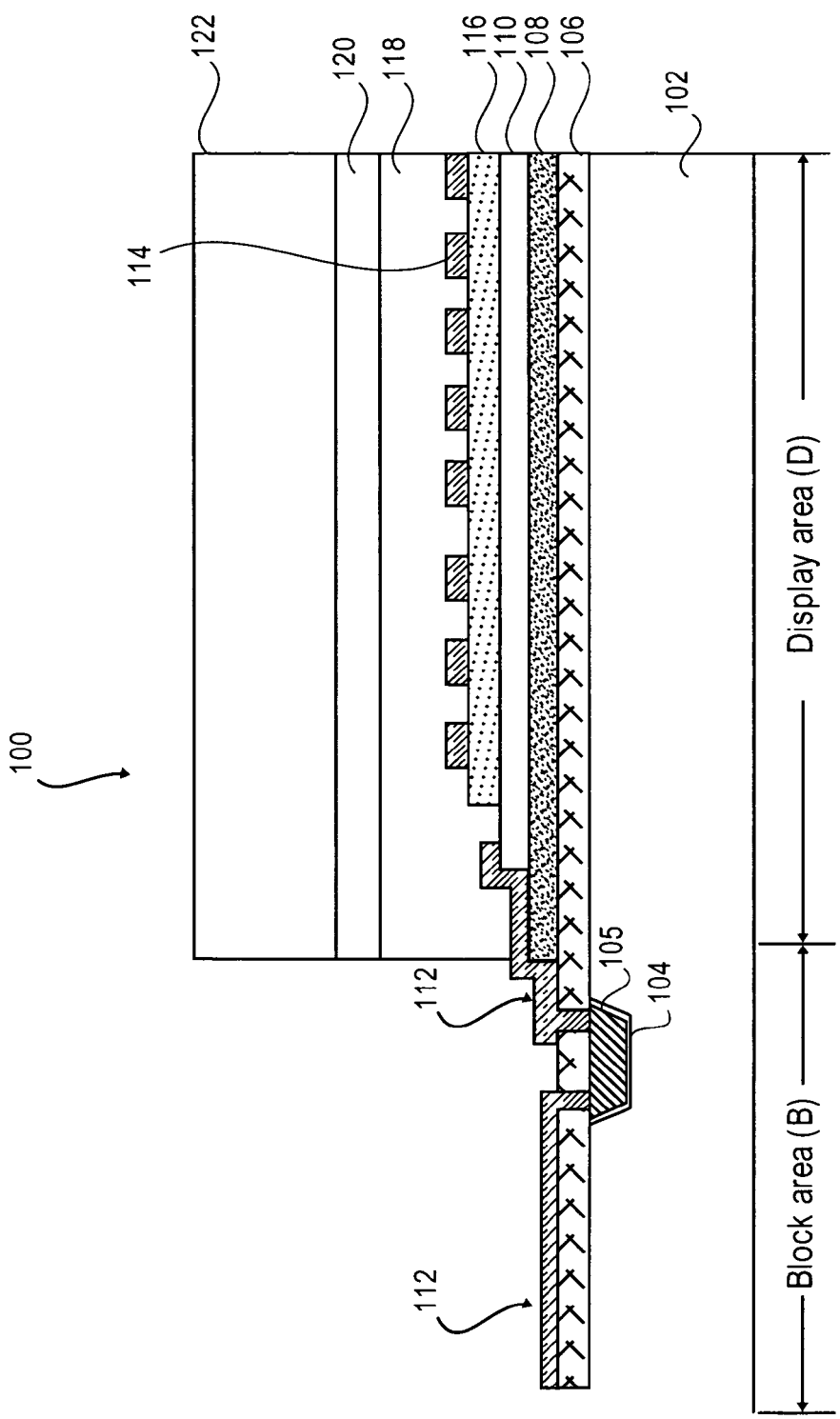
FIG. 1 illustrates an exemplary display with the functional block being embedded within the display substrate and placed outside of the display area and the display area being substantially seal with barrier layers.

FIG. 1 illustrates an exemplary embodiment of a flat panel display 100. The flat panel display device 100 can be incorporated into a LCD or an OLED/PLED or other flat panel display. These flat panel displays are similar in all aspects except for the display medium. The discussion below focuses on configurations for an OLED or a PLED but it is to be noted that similar configurations can be used for any type of flat panel display. The display 100 comprises a substrate 102, a functional block 105, an optional planarization layer 106, barrier layers 108 and 118, two electroconductive layers (electrodes), 110 and 114, a display medium 116, and an optional substrate lid 122.

The substrate 102 is divided into two areas, an area "D" dedicated to a display area, and an area "B" dedicated to a functional block area. The display area "D" is where a display medium and other functional layers such as electroconductive layers and protecting layers reside. The functional block area is where integrated circuitry components that drive the display 100 or the pixel images of the display 100 reside. The substrate 102 can be made out of transparent material such as plastic or any other suitable material for making a display. In a preferred embodiment, the substrate 102 is made out of a flexible material suitable for used in a flat panel display. The substrate 102 can be permeable to substances such as water, oxygen, reagent, and other contamination. This enables flexibility in choosing the material for the substrate 102 without hindering the cost of making the display 100. The substrate 102 further includes a receptor site 104, which is configured to receive a functional block 105.

In a preferred embodiment, the receptor site 104 and the functional block 105 have matching shape and size. For example, if the functional block 105 are square shaped, the receptor sites are designed to be square shaped and slightly larger than the blocks to allow the block 105 to closely fit within the receptor sites. The functional block 105 and the receptor site 104 shown in this figure both have a trapezoidal shape. Techniques such as casting, stamping, embossing, and injection molding, can be used to create the receptor site 104. The exemplary embodiment illustrated in this figure depicts that the receptor site 104 is a recessed region created into the surface of the substrate 102. However, having the receptor site 104 being recessed is not a limitation. For example, if the substrate 102 is an organic material and is an amorphous or semicrystalline polymer, the receptor site 104 may be embossed into the polymer material with a mold that matches the block size and pitch for the device being produced. The receptor site 104 can be molded or carved into a surface, or, be designed as a raise area of the substrate 102. The receptor site 104 thus can be recesses, protrusions, bulges, or protuberances.

Continuing with FIG. 1, in this embodiment, the functional block 105 is deposited within the receptor site 104 of the substrate 102. It is preferred that the functional block 105 be embedded within the substrate 102 and deposited below a surface of the substrate 102. The functional block 105 has a top surface upon which at least one circuit element is situated. The circuit element on the top surface of the functional block 105 may be an ordinary integrated circuit (IC) for any particular function. For example, the IC may be designed to drive a pixel of the display 100 or any other display. The IC may also be designed to receive power from another circuit for the operation of a passive RF ID tag. Alternatively, the IC may be designed to receive power from an energy source (e.g. battery) for the operation of an active RF ID tag. In one example, the functional block 105 is created from a host substrate and separated from this substrate. This method of making the functional block can be found in the method described in U.S. Pat. No. 6,291,896 which is entitled "Functionally Symmetric Integrated Circuit Die." Alternatively, the functional block can be the NanoBlock®IC's made by Alien Technology, Morgan Hill, Calif. In a preferred embodiment, the functional block 105 also comprises a plurality of connection pads (not shown) formed on the top surface of the functional block 105 to connect the functional block to the appropriate electroconductors in the display 100. The connection pads can be made out of conductive material (e.g., metals, aluminum, gold, silver, copper, conductive polymer, or other suitable conductive materials).

The planarization layer 106 of is an insulation layer made out of a dielectric material, (e.g., silicon dioxide) which can comprise of a material selected from a group of materials such as polyimide, epoxy, photo imageable polymer or permanent photoresist. The planarization layer 106 is deposited on top of the substrate 102, over the entire surface of the substrate 102 using conventional deposition methods such as chemical vapor deposition and physical vapor deposition. The planarization layer 106 further includes a plurality of openings typically referred to as vias. The vias can be created into the planarization layer 106 using techniques such as photolithography (photoresist masking) and etching well known in the art. The vias enable access or contact to the functional block for necessary interconnections. As mentioned, the functional block 105 comprises electrical conducting pads (not shown) on its surface. These conducting pads establish the electrical interconnections between the functional blocks 105 to each other (another functional block, not shown) and to other necessary driving circuitry through the use of metal conductors such as metal lines 112. Examples of conducting materials that can be used as the metal lines 112 include metal, metal alloys, conductive polymer, and other suitable conductive material.

Next, the barrier layer 108 is deposited over the planarization layer 106 outside the functional block area "B." The barrier layer 108 does not cover the functional block 105 that is deposited within the substrate 102. In one preferred embodiment, the barrier layer 108 is only deposited over the portion of the planarization layer 106 that lies within the display area "D." This barrier layer is an inorganic layer, organic layer, or a combination of both, and can be made out of silicon nitride or other compatible material that can insulate and protect the display medium 116. Examples of an organic barrier material further include poly(vinyl alcohol), polyacrylonitrile, poly(vinybutyral) mixed with epoxy resin or organically modified ceramic, and poly(hydroxy amid ether). Examples of inorganic barrier material further include sputtered oxides such as $SiO_2$ and $Ta_2O_5$. The barrier layer 108 can also be a combination of an organic and inorganic material. In one example, the barrier layer 108 protects the display medium 116 that is sensitive to water, oxygen, other contaminants, or micro contaminants. In another example, the barrier layer 108 prevents degradation to the electroluminescent medium 116 when the display 100 is an OLED or a PLED.

Continuing with FIG. 1, in a preferred embodiment, the electroconductive layer 110 is an electrode that acts as an anode for the display 100. The first electrode layer 110 is deposited over the first barrier layer 108. The first electrode layer 110 does not cover the functional block 105 that is deposited in the substrate 102 in the functional block area "B." The first electrode layer 110 can be made out of tin oxide, indium oxide, tin toped indium oxide, or indium tin oxide (ITO), Au, $SnO_2$, or other suitable light transmissive electrically conductive materials. The first electrode layer 110 can be highly transparent in the visible spectrum and low resistive. The first electrode layer 110 is continuous in active area. The first electrode layer 110 is patterned to define electronic components of the display 100. In one case, the first electrode layer 110 has a pattern that defines rows and columns used for multiplex addressing a passive matrix display. In another case, the first electrode layer 110 has a pattern that defines rows and columns used for multiplex addressing a segment of the display 100.

As shown in FIG. 1, the next layer is the display medium layer 116 which can be a convention display material typically used for a flat panel display. Examples of the display material include, (but are not limited to), liquid crystal compound for LCD, organic light emitting diode for OLED, polymer light emitting diode for PLED, (generally known as light emitting polymer), plasma-forming gas for plasma display, and phosphors and molybdenum for field emission display. The configurations of these flat panel displays are similar (see below).

FIG. 4 illustrates an exemplary display medium stack 116 that can be incorporated into some embodiments. The display medium stack comprises of a layer of tris-(8-hydroxyquinolinine) aluminum ($Alq_x$) 116c, a layer of diamine 4,4'-bis[N-(1-napthyl)-N-Phenyl-amino]biphenyl (NPB) 116b, and a layer of copper phthalocyanine (CuPc) 116c. The display medium stack shown in this figure is an example of a convention OLED display material which is typically a heterostructure device having the necessary hole transport layer and electron transport layer.

Next, the electrode layer 114 is deposited over the display medium 116. The electrode layer 114 acts as a cathode for the display 100. The electrode layer 114 is also patterned using conventional techniques. Further, the electrode layer 114 can be made out of a transparent material, which is useful for a top-emitting display. The electrode can be made out of an electro conductive metal, ITO, Mg:Ag alloy, Ca, Mg, Al, and any other suitable metal or metal alloy. An example of a transparent cathode includes a Ca/ZnSe stack, which includes a thin Ca film, and a layer of thermally evaporated ZnSe deposited on top of the Ca film, as described in U.S. Pat. No. 5,739,545 entitled "Organic Light Emitting Diodes Having Transparent Cathode Structures." A transparent cathode such as the Ca/ZnSe stack allows flexibility in choosing the material for the substrate 102, especially for the fabrication of an OLED/PLED display. For example, the substrate 102 can be made out of silicon or other suitable opaque material because with the transparent cathode, the emitted light from the display medium can emit through the transparent cathode.

FIG. 3 illustrates an exemplary transparent cathode 114 that can be incorporate into some of the embodiments. The transparent cathode includes a layer of metal film (e.g., Ca) 114a which is covered with a layer of ZnS or ZnSe 114b deposited thereon by thermo evaporation.

Next, the second barrier layer 118 is deposited over the entire area of the display area "D" covering the patterned electrode layer 114 as well as all other layers such as the display medium 116 and the electrode layer 110. In one embodiment, the barrier layer 108 and the second barrier 118 substantially seal the display area "D" of the display 100. Substantially seal refers to the barrier layer 108 and the barrier 118 contact each other with a thin metal line such as metal line 112 between them. Thus, only the thin conductive lines (e.g., metal line 112) from the embedded functional block 105 to the active display area "D" prevents the barrier layer 108 and the barrier 118 from immediately contacting each other along the side of the display area "D" in a seal area. There is minimal separation of the barrier layer 108 and the barrier 118 allowing these two barrier layers to substantially seal the active display area "D" to protect the display medium and other active device within this area.

Similar to the barrier layer 108, this second barrier layer 118 is an inorganic layer, organic layer, or a combination of both, and can be made out of silicon nitride or other compatible material that can insulate and protect the display medium 116. Examples of an organic barrier material further include poly(vinyl alcohol), polyacrylonitrile, poly(vinybutyral) mixed with epoxy resin or organically modified ceramic, and poly(hydroxy amid ether). Examples of inorganic barrier material further include sputtered oxides such as $SiO_2$ and $Ta_2O_5$. The barrier layer 118 can also be a combination of an organic and inorganic material. The barrier layer 118 protects the display medium 116 that is sensitive to water, oxygen, other contaminants, or micro contaminants. The barrier layer 118 also prevents degradation to the electroluminescent medium 116 when the display 100 is an OLED or a PLED.

In one example, the display 100 includes a sealant layer 120 before the substrate lid 122 is placed over the display area "D." The sealant layer 120 may be made out of epoxy, silicone, urethane, acrylic resin, or any other suitable sealing material known in the art. The last layer is the substrate lid 122 which can be made out of metal foil, paper, plastic, polymers, polyamide, polycarbonate, or other suitable material. The substrate lid 122 can be made out of the same material that is used to make the substrate 102.

It is to be noted again that the functional block 105 which drives the display 100 is placed outside of the display area "D." Contacts from the functional block 105 can be made to the active components inside the display area "D" through a thin metalization layer. For example, contact line 112 is shown to connect the functional block 105 to the electrode layer 110. In one embodiment, the contact line 112 is an extension of the patterned electrode layer 110. In other embodiments, the contact line 112 can be made out of metals, aluminum, gold, silver, copper, conductive polymer, and etc. . . . As mentioned above, the contact line 112 is the only thing that separates the barrier layer 108 and the barrier layer 118 from immediate contact at the edge of the display where contact needs to be made to the functional block 105. The display 100 is thus substantially sealed with the two barrier layers to prevent contamination from leaking into the device. This is especially useful when the display 100 is made with low cost substrate 102 such as plastic. Furthermore, the barrier layers enable the use of flexible substrates that are permeable to micro-contaminant but that are good for making a flexible display.

FIG. 2 illustrates another exemplary embodiment, flat panel display 101. The display 101 is similar to the display 100 with additional detail configurations being included. The flat panel display device 101 can be incorporated into a LCD or an OLED/PLED or other flat panel display. Similar to the display 100, the display 101 comprises the substrate 102, the functional block 105, the planarization layer 106, the barrier layers 108 and 118, the two electroconductive layers (electrodes), 110 and 114, the display medium 116, and the substrate lid 122. Additionally, the display 101 comprises a contact plate 132 deposited on top of the barrier layer 108 to facilitate electrical contact from all of the active layers within the display area "D" to the functional block 105 in the functional block area "B." The contact plate can be made out of a conductive material such as metals, aluminum, gold, silver, copper, conductive polymer, and etc . . . . In one example, the contact plate can be an extension of the electrode layer 110. Metal lines 134 made out of conductive material can then be used to interconnect the electrode 110, the electrode 114, and the display medium 116 to the contact plate which in turns interconnects to the functional block 105 through the metalization layer 112 and the via in the planarization layer 106.

In one exemplary embodiment, the display 101 includes an interlayer dielectric 130 to insulate the individual rows and columns of the electrode 110 and the electrode 114.

Figure 5:
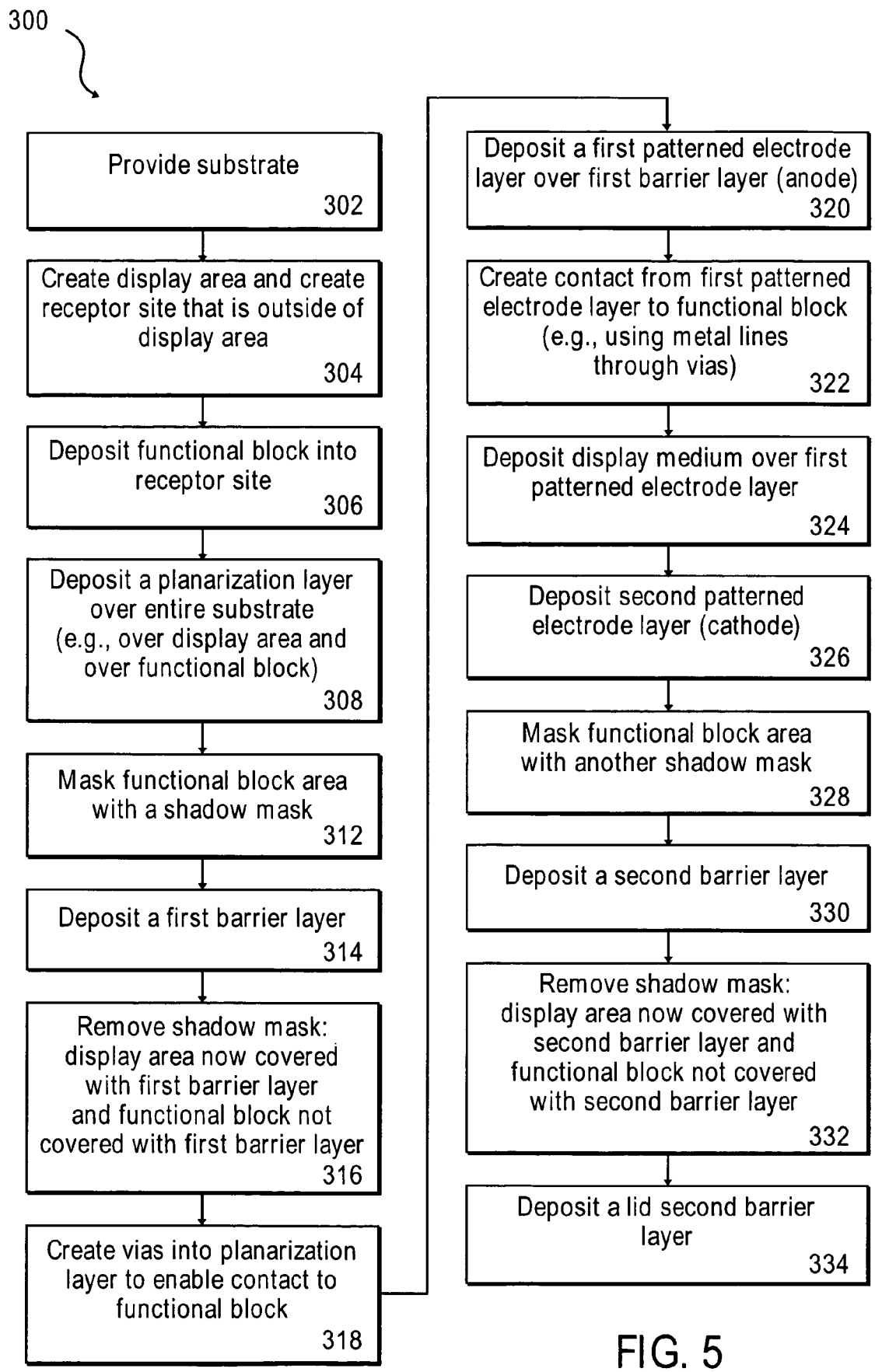
FIG. 5 illustrates an exemplary method of making a display that has the functional block being embedded within the display substrate and placed outside of the display area and the display area being substantially seal with barrier layers.

FIG. 5 illustrates an exemplary method 300 of making a device such as the display 100 and the display 101 described above.

At operation 302, a substrate is provided. At operation 304, a display area is created within the substrate. A receptor site is also created into the substrate. The receptor site is located outside of the display area. Well-known techniques such as casting, stamping, embossing, and injection molding, can be used to create the receptor site.

At operation 306, a functional block is deposited into the receptor site. The functional blocks 204 can be created according using known method such as the method described in U.S. Pat. No. 6,291,896 which is entitled "Functionally Symmetric Integrated Circuit Die." Alternatively, the functional block can be the NanoBlock® IC's made by Alien Technology, Morgan Hill, Calif. In one example, the functional blocks 204 are embedded and recessed below the surface of the substrate. Any conventional method of depositing microstructure onto a substrate can be used, for example, fluidic self-assembly (FSA) well known in the art. A slurry solution is used in FSA. One way to assist this deposition is to tilt the web line of the substrate during the FSA process so that gravity helps the functional blocks to couple to the receptor sites. A fluid flow can also be used to facilitate the dispensing of the functional block. One way to create the fluid flow is by using a suitable pump to create a continuous flow of the slurry solution to push it across the web during the FSA process. In yet another example, a pressure field can be applied to the slurry solution to facilitate the dispensing of the functional block. Here, pressure can be created by using an ultrasonic sound device or by applying a vibration to the web to exert forces upon slurry solution during the FSA process. In another example, the slurry solution may be a gas or mixture of gases, such as air, nitrogen, $O_2$, $CO_2$, CO, SF6, or a gas saturated with water vapor, or a liquid may be used, such as de-ionized water, formamide, ethyl alcohol, methyl alcohol, organic solvents, chlorofluorocarbons, mineral oils, liquid CO2, or mixtures of these liquids, or a liquid with additives, such as de-ionized water with a surfactant or detergent agent. In such an arrangement, the functional blocks are entrained in a fluid flow and carried by the transport fluid over a substrate. The fluid flow may be driven by an external force, for example, by gravity, mechanical pumping, thermal-convection currents, or bubbling a gas through a liquid transport fluid. Random motion of functional blocks over a substrate can be driven by mechanical stirring of the transport fluid, flow of the transport fluid, bubbling a gas through a liquid transport fluid, or mechanical or sonic agitation or vibration of the substrate, transport fluid, or mounting apparatus.

At operation 308, a planarization layer is deposited over the entire substrate. The planarization layer is not always necessary. When the functional block is embedded within the substrate and below the surface of the substrate, there is no need for the planarization layer. Conventional deposition methods such as chemical vapor deposition and physical vapor deposition can be used to blanketly deposit the planarization layer.

At operation 312, the area on the substrate that has the functional block deposited therein (e.g., the functional block area "B" discussed above) is protected with a shadow mask to prepare the display for the deposition of the barrier layer. At operation 314, the barrier layer is deposited over the entire surface. The shadow mask prevents any barrier layer material from being deposited over the functional block. Conventional method such as chemical vapor deposition and physical vapor deposition and sputtering can be used to form the barrier layer. At operation 316, the shadow mask is removed. At this point, the display area of the display is covered with the barrier layer while the functional block area, the area protected by the shadow mask is not covered with the barrier layer. The integrity of the barrier layer is thus not disturbed by the via that would need to be created to allow contact to the functional block if the barrier layer were to cover the functional block area.

At operation 318, vias (openings) are created into the planarization to enable contact to the functional block. Conventional techniques such as photolithography (photoresist masking) and etching well known in the art can be used to create the via in the planarization layer.

At operation 320, a first patterned electrode layer is deposited over the barrier layer. The first patterned electrode layer is an anode in this example. To create the first patterned electrode layer, an electroconductive material is first blanketly deposited over the barrier layer within the display area using well-known techniques such as sputtering, physical vapor deposition, chemical vapor deposition, coating from a liquid coating solution, spin coating, dip coating, rod coating, blade coating and etc . . . . In one example, the first patterned electrode layer is first deposited using a well-known RF sputtering technique from an ITO target and followed by a thermal treatment. This blanketly deposited layer is next patterned using, for example, a patterned die pressing into the layer and lifting off to create the desirable pattern in the electrode layer. This technique can also be referred to as "lift-off." In another example, the first patterned electrode layer can be created using conventional photolithography and wet etching technique, also well known in the art. In yet another example, the first patterned electrode layer can be created using conventional printing techniques such as ink jet printing, toner jet printing, and electrographic printing.

At operation 322, contacts from the first patterned electrode layer to the functional block is created using metalization (e.g., depositing metal lines from the first patterned electrode layer and connecting the metal line to contact pads on the functional block through the via.

At operation 324, a display medium is deposited over the first patterned electrode layer. In one example, the display medium is an OLED or a PLED display material. Here, the display medium can be deposited by spin coating. In one example, another shadow mask is placed over the area of the substrate where the functional block resides prior to the deposition of the display medium. In this example, the display medium lies within the area of the substrate where the barrier layer covers. One reason for this is that the barrier needs to protect the display medium. In another example, the display medium is supplied as a stack such as the display stack shown in FIG. 4. In this case, the display medium is first deposited over the substrate and then patterned so that it lies within the area of the barrier layer and does not cover the functional block.

At operation 326, a second patterned electrode layer is deposited over the display medium. The second patterned electrode acts as a cathode in this example. In another example, the second patterned electrode is a transparent cathode such as the one shown in FIG. 3. In one example, the cathode is transparent and the anode needs not be transparent for a device that is a top-emitting device. In another example, the cathode needs not be transparent and the anode needs to be transparent for device that is a bottom-emitting device. The same techniques that are used to deposit the first patterned electrode (anode) over the barrier layer can be used to deposit the second patterned electrode (cathode) over the display medium. In one example, the anode and the cathode form a grid or a matrix comprising of rows and columns that are used to generate a pixel image for a display device.

At operation 328 a shadow mask is used to block the area on the substrate where the functional block resides. A second barrier layer is then deposited at operation 330 using the same techniques as operation 314 above. And, at operation 332, the shadow mask is removed. At this point, the display area of the display is covered with the barrier layer while the functional block area, the area protected by the shadow mask is not covered with the second barrier layer. Furthermore, the two barrier layers now substantially seal the active device in the display area, especially the display medium. A sealant may be applied before the substrate lid is placed over the second barrier layer at operation 334.

It is to be noted that not all of the operations are necessary to produce a working device according to the present invention. Some of the operations may be performed out of order without deviating from the embodiments of the present invention.

It is to be appreciated that the discussion above is similarly applicable to other types of devices and other types of flat panel displays besides OLED/PLED (e.g., LCD, PD, and FED).

An exemplary LCD made in accordance with the some of the embodiments comprises two parallel substrates, such as the substrate 102 and the substrate lid 122. Each of the substrate carries on its inner surface an electroconductive layer (e.g., the electrode layer 110 and the electrode layer 114), and a barrier layer (e.g., the barrier layer 108 and the barrier 118). A liquid crystal orientation layer (not shown), also called alignment layer, may also be included. In color LCDs, one of the substrates is also provided with a color filter (not shown).

An exemplary PD made in accordance with the some of the embodiments comprises two parallel substrates (similar to the case of the exemplary LCD) enclosing a gas-filled volume. Each of the substrate carries on its inner surface an electroconductive layer (e.g., the electrode layer 110 and the electrode layer 114), and a barrier layer (e.g., the barrier layer 108 and the barrier 118). The gas can be one of the noble gases or a mixture thereof. By charging the electrodes present in the gas-filled cavity with a high voltage, typically about 100 V, a plasma discharge is generated which emits UV light. The UV light may excite phosphors which are present on the cell walls of the display so as to obtain color images. A color filter may also be present to improve the color appearance of the display. The patterned electrode layers may be shielded from the plasma by applying a dielectric protecting layer, which comprises, for example, lead oxide or magnesium oxide.

An exemplary FED made in accordance with the some of the embodiments comprises two parallel substrates (similar to the case of the exemplary LCD) glass plates which are provided with functional layers. In addition to the patterned electroconductive layers mentioned in the LCDs and PDs, one of the substrate of the FED is provided with a large number of microtips of electron gun comprising of, for example, molybdenum, which each act as a microscopic electron gun. When charged up to a high voltage from 200 to 800 V, these microtips emit an electron beam towards a phosphor layer on the opposite substrate, which typically carries an ITO layer as a counter electrode. The emission forms the pixel image of the display.

I claim:

1. An assembly comprising:
   a substrate having a display area and at least one receptor site configured to receive a functional block, said functional block deposited within said receptor site, embedded below a surface of said substrate, and being outside said display area;
   a first barrier layer deposited over said display area, said first barrier layer not covering said functional block;
   a first patterned electrode layer deposited over said first barrier layer, said first patterned electrode layer making contact to said functional block;
   a display medium deposited over said first patterned electrode layer;
   a second patterned electrode layer deposited over said display medium; and
   a second barrier layer deposited over said second patterned electrode layer.

2. An assembly as in claim 1 further comprising:
   a planarization layer deposited over said substrate, said planarization layer covering said functional block and having contact vias created therethrough to allow contact to said functional blocks.

3. An assembly as in claim 1 wherein said substrate is selected from a group consisting of plastic, polymer, polyamide, polycarbonate.

4. An assembly as in claim 1 wherein said substrate is flexible.

5. An assembly as in claim 1 wherein one of said first patterned electrode layer and said second patterned electrode layer is transparent.

6. An assembly as in claim 1 wherein one of said first barrier layer and said second barrier layer is transparent.

7. An assembly as in claim 1 wherein said first barrier layer and said second barrier layer substantially seal said display area.

8. A method of making an electronic assembly:
   providing a display area on a substrate having at least one receptor site configured to receive a functional block, said functional block deposited within said receptor site, embedded below a surface of said substrate, and being outside said display area;
   depositing a first barrier layer over said display area, said first barrier layer not covering said functional block;
   depositing a first patterned electrode layer over said first barrier layer, said first patterned electrode layer making contact to said functional block;
   deposing a display medium over said first patterned electrode layer;
   depositing a second patterned electrode layer over said display medium; and
   depositing a second barrier layer over said second patterned electrode layer.

9. The method as in claim 8 further comprising:
   depositing a planarization layer over said substrate, said planarization layer covering said functional block and having contact vias created therethrough to allow contact to said functional blocks.

10. The method as in claim 8 wherein said substrate is selected from a group consisting of plastic, polymer, polyamide, and polycarbonate.

11. The method as in claim 8 wherein said substrate is flexible.

12. The method as in claim 8 wherein one of said first patterned electrode layer and said second patterned electrode layer is transparent.

13. The method as in claim 8 wherein one of said first barrier layer and said second barrier layer is transparent.

14. The method as in claim 8 wherein said first barrier layer and said second barrier layer substantially seal said display area.

15. The method as in claim 8 further comprising:
depositing a contact pad within said display area to enable interconnections from said first patterned electrode layer and said second patterned electrode layer to said functional block.

16. The method as in claim 8 further comprising:
blocking said functional block during depositions of said first barrier layer and said second barrier layer.

* * * * *